(12) United States Patent
Zhang et al.

(10) Patent No.: US 12,185,517 B2
(45) Date of Patent: Dec. 31, 2024

(54) DISPLAY DEVICE

(71) Applicants: Chengdu BOE Optoelectronics Technology Co., Ltd., Sichuan (CN); BOE Technology Group Co., Ltd., Beijing (CN)

(72) Inventors: Shuang Zhang, Beijing (CN); Xiaoxia Huang, Beijing (CN); Bing Ji, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 383 days.

(21) Appl. No.: 17/637,258

(22) PCT Filed: Apr. 8, 2021

(86) PCT No.: PCT/CN2021/085956
§ 371 (c)(1),
(2) Date: Feb. 22, 2022

(87) PCT Pub. No.: WO2021/227712
PCT Pub. Date: Nov. 18, 2021

(65) Prior Publication Data
US 2022/0312654 A1     Sep. 29, 2022

(30) Foreign Application Priority Data
May 14, 2020 (CN) .......................... 202010406295.8

(51) Int. Cl.
*H05K 9/00* (2006.01)
(52) U.S. Cl.
CPC .................................. *H05K 9/0081* (2013.01)

(58) Field of Classification Search
CPC ......... H05K 1/028–0281; H05K 1/189; H05K 7/20954–20963; H05K 9/0054; H05K 9/0081
See application file for complete search history.

(56) References Cited

U.S. PATENT DOCUMENTS

2001/0033009 A1* 10/2001 Inoue ................. H05K 7/20963
257/668
2014/0339520 A1* 11/2014 Xie ........................ H10K 59/12
257/40
(Continued)

FOREIGN PATENT DOCUMENTS

CN     101384157 A     3/2009
CN     105992508 A     10/2016
(Continued)

OTHER PUBLICATIONS

CN202010406295.8 first office action.

*Primary Examiner* — Jacob R Crum
(74) *Attorney, Agent, or Firm* — IPro, PLLC

(57) ABSTRACT

Disclosed is a display device, comprising: a display panel (10), wherein the display panel (10) comprises a display area (AA), a bending area (BB) and a bonding area (CC), with the bending area (BB) being arranged between the display area (AA) and the bonding area (CC); a support heat dissipation structure (20), with the support heat dissipation structure (20) being disposed on a non-display surface (10b) of the display area (AA); a driving chip (30), with the driving chip (30) being fixed to a bonding surface (10c) of the bonding area (CC); and an electromagnetic shielding structure (40), with the electromagnetic shielding structure (40) being fixed onto a side of the support heat dissipation structure (20) away from the display panel (10).

20 Claims, 2 Drawing Sheets

(56) References Cited

U.S. PATENT DOCUMENTS

| | | | |
|---|---|---|---|
| 2018/0157093 A1* | 6/2018 | Jang | ............... H05K 1/144 |
| 2018/0341290 A1* | 11/2018 | Sim | ............... G06F 1/1658 |
| 2019/0394869 A1 | 12/2019 | Kim et al. | |
| 2020/0022261 A1 | 1/2020 | Choi | |
| 2020/0192433 A1* | 6/2020 | Shin | ............... G06F 1/206 |
| 2021/0242299 A1 | 8/2021 | Saeki | |

FOREIGN PATENT DOCUMENTS

| | | |
|---|---|---|
| CN | 109559640 A | 4/2019 |
| CN | 110224081 A | 9/2019 |
| CN | 110634395 A | 12/2019 |
| CN | 110955090 A | 4/2020 |
| CN | 111028682 A | 4/2020 |
| IN | 111462634 A | 7/2020 |
| WO | 2020084940 A1 | 4/2020 |

\* cited by examiner

DISPLAY DEVICE

CROSS REFERENCE TO RELATED APPLICATIONS

The present application is a National Stage of International Application No. PCT/CN2021/085956, filed Apr. 8, 2021, which claims priority to Chinese Patent Application No. 202010406295.8, entitled "Display Device", and filed to the China National Intellectual Property Administration on May 14, 2020, the entire contents of which are incorporated herein by reference.

FIELD

The present disclosure relates to the technical field of display, in particular to a display device.

BACKGROUND

With the continuous development of a display technology, flexible display devices have become more and more widely used in electronic equipment due to their advantages such as good impact resistance, lightness and thinness.

SUMMARY

Embodiments of the present application provide a display device, includes:
- a display panel, including a display area, a bending area and a bonding area, where the bending area is arranged between the display area and the bonding area;
- a support heat dissipation structure, disposed on a side of a non-display surface of the display area;
- a driving chip, fixed to a bonding surface of the bonding area; and
- an electromagnetic shielding structure, fixed on a side, facing away from the display panel, of the support heat dissipation structure.

In some embodiments, the electromagnetic shielding structure includes: a double-sided adhesive tape, fixed on a side, facing away from the display panel, of the support heat dissipation structure; a wave-absorbing material layer, disposed on a side, facing away from the display panel, of the double-sided adhesive tape; and an insulating Mylar sheet, disposed on a side, facing away from the display panel, of the wave-absorbing material layer; and an orthographic projection of the electromagnetic shielding structure on the display panel covers an orthographic projection of the driving chip on the display panel.

In some embodiments, the insulating Mylar sheet is stuck to a side, facing the driving chip, of the support heat dissipation structure.

In some embodiments, the insulating Mylar sheet includes a non-sticking area and a sticking area surrounding the non-sticking area, the non-sticking area is in contact with the wave-absorbing material layer, and the sticking area is stuck to the support heat dissipation structure.

In some embodiments, the wave-absorbing material layer includes a matrix material and a dielectric wave-absorbing material distributed in the matrix material.

In some embodiments, the matrix material includes an organic adhesive or an inorganic adhesive, and the dielectric wave-absorbing material includes at least one of barium titanate, ferrite, or soft magnetic metal.

In some embodiments, a thickness of the wave-absorbing material layer ranges from 0.03 mm to 0.1 mm.

In some embodiments, the support heat dissipation structure includes a heat dissipation layer and a support layer disposed in a stack, the heat dissipation layer is close to the display panel, and the support layer is far away from the display panel; an orthographic projection of the heat dissipation layer on the display panel covers the display area, and an orthographic projection of the support layer on the display panel is within an orthographic projection of the bonding area on the display panel;

the display device further includes a thin film disposed in contact with the bonding surface of the bonding area, the driving chip is fixed on a side, facing away from the display panel, of the thin film, and an orthographic projection of the driving chip on the display panel and the orthographic projection of the bonding area on the display panel do not overlap; and the insulating Mylar sheet is stuck to a side, facing the driving chip, of the heat dissipation layer.

In some embodiments, the display device further includes a sealing glue layer disposed on a side, facing away from the display panel, of the driving chip, and a wave-absorbing material is distributed in the sealing glue layer.

In some embodiments, the display device further includes a first back film disposed on a side, facing the support heat dissipation structure, of the non-display surface of the display area, and a second back film disposed on a side, facing the support heat dissipation structure, of a non-bonding surface of the bonding area.

DETAILED DESCRIPTION OF THE EMBODIMENTS

Figure 1:
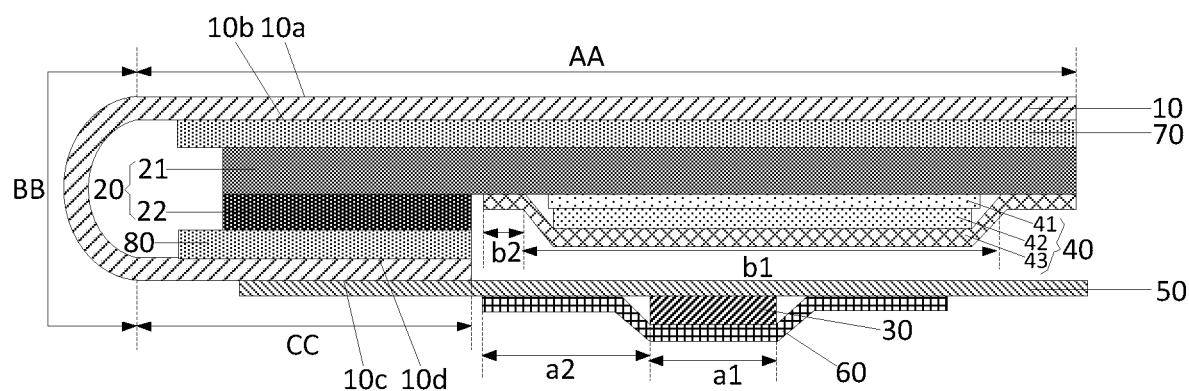
FIG. 1 is a schematic cross-sectional structure diagram of a display device, provided by an embodiment of the present disclosure.

In order to make the objectives, technical solutions, and advantages of embodiments of the present disclosure clearer, the technical solutions of embodiments of the present disclosure will be described clearly and completely in combination with the accompanying drawings of embodiments of the present disclosure. Apparently, the described embodiments are some, but not all, embodiments of the present disclosure. Under the condition of no conflict, embodiments in the present disclosure and the features in embodiments can be combined with each other. Based on the described embodiments of the present disclosure, all other embodiments attainable by those ordinarily skilled in the art without involving any inventive effort are within the protection scope of the present disclosure.

Unless defined otherwise, technical or scientific terms used in the present disclosure shall have the ordinary meaning as understood by those ordinarily skilled in the art to which the present disclosure belongs. The word "include" or "comprise", and the like used in the present disclosure, means that a component or an article that precedes the word is inclusive of the component or article listed after the word and equivalents thereof, but does not exclude other components or articles. The terms "connection" or "connected", and the like, are not limited to physical or mechanical connections, but may include electrical connections, whether direct or indirect. The terms "inner", "outer", "upper", "lower", and the like are used merely to denote a relative positional relationship that may change accordingly when the absolute position of an object being described changes.

It should be noted that the dimensions and shapes of various figures in the drawings are not to truly scale and are intended to be merely illustrative of the present disclosure. The same or similar reference numerals refer to the same or similar components or components having the same or similar functions throughout.

At present, gaming mobile phones are more and more popular among young people. However, in order to ensure the game effect and improve the smooth performance of a screen, the gaming mobile phones in the market require higher refresh frequency, which is generally defined as 90 Hz. As the refresh frequency of the mobile phones is faster, the requirements for the performance and working stability of an integrated circuit (IC) are higher. The IC generally has the functions of transmitting and processing displayed image information. If the IC is not working properly, it will cause a series of problems that the screen is blurred, black and white. Therefore, the IC plays a key role in mobile phone display modules. The IC is extremely fragile and extremely susceptible to electromagnetic waves.

In order to prevent the IC from working abnormally due to the influence of electromagnetic waves generated on a circuit in a panel, embodiments of the present disclosure provide a display device. The display device is a flexible display device, as shown in FIG. 1, which may include:

a display panel 10, which is a flexible display panel that can be bent, where a base substrate of the display panel 10 is a flexible base substrate, a material of the flexible base substrate is not limited, such as plastic substrates with excellent heat resistance and durability, like polyimide, polyvinyl ether phthalate, polyetherimide, or polyethersulfone; the display panel 10 includes a display area AA, a bending area BB, and a bonding area CC; the display area AA is configured to display images, a surface on which the images are displayed in the display area AA is called a display surface 10a, and a side opposite to the display surface 10a is called a non-display surface 10b; the bending area BB is arc-shaped and is arranged between the display area AA and the bonding area CC; the side, facing away from the display area AA, of the bonding area CC is called a bonding surface 10c; the side, facing the display area AA, of the bonding area CC is called a non-bonding surface 10d; and the bonding surface 10c is configured to connect a driving chip 30 and a flexible printed circuit (FPC) (not shown in the figure), and transmit a driving signal to the display panel 10; and, in embodiments of the present disclosure, the driving chip 30 is disposed on a thin film 50 (described later), that is, the driving chip 30 is bound by a chip on film (COF) method;

a support heat dissipation structure 20, disposed on a the non-display surface side 10b of the display area AA;

the driving chip 30, fixed to the bonding surface 10c of the bonding area CC; and an electromagnetic shielding structure 40, fixed on a side, facing away from the display panel 10, of the support heat dissipation structure 20.

According to the above display device provided by embodiments of the present disclosure, the electromagnetic shielding structure 40 is disposed on the side, facing away from the display panel 10, of the support heat dissipation structure 20, which is equivalent to providing the electromagnetic shielding structure 40 on the side, facing the display panel 10, of the driving chip 30, so that electromagnetic interference in the driving chip 30 from electromagnetic waves generated by circuits in the display panel 10 is prevented, thereby improving the performance and working stability of the driving chip 30.

Figure 2:
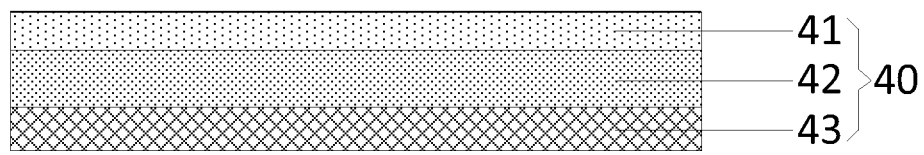
FIG. 2 is a partial schematic structure diagram of an electromagnetic shielding structure, provided by an embodiment of the present disclosure.

In some embodiments, as shown in FIG. 1 and FIG. 2, FIG. 2 is a partial structural diagram of the electromagnetic shielding structure in FIG. 1, and the electromagnetic shielding structure 40 includes: a double-sided adhesive tape 41, fixed on a side, facing away from the display panel 10, of the support heat dissipation structure 20; a wave-absorbing material layer 42 disposed on a side, facing away from the display panel 10, of the double-sided adhesive tape 41; and an insulating Mylar sheet 43 disposed on a side, facing away from the display panel 10, of the wave-absorbing material layer 42; and an orthographic projection of the electromagnetic shielding structure 40 on the display panel 10 covers an orthographic projection of the driving chip 30 on the display panel 10. In some embodiments, the function of the double-sided adhesive tape 41 is to stick the wave-absorbing material layer 42 on the surface of the support heat dissipation structure 20; since the surface of the wave-absorbing material layer 42 has a layer of metal particles (a dielectric wave-absorbing material described later), in order to prevent the metal particles from falling and causing scratches, indentations and other damage to the driving chip 30, it is necessary to cover a layer of insulating Mylar sheet 43 on a surface, facing away from the display panel 10, of the wave-absorbing material layer 42 to prevent the falling of the metal particles. In addition, in the present disclosure, the orthographic projection of the electromagnetic shielding structure 40 on the display panel 10 is set to cover the orthographic projection of the driving chip 30 on the display panel 10, which is equivalent to forming an electromagnetic shielding protection structure on the periphery of the driving chip 30, so that electromagnetic interference in the driving chip 30 from the electromagnetic waves generated by the circuits in the display panel 10 is further prevented.

Figure 3:
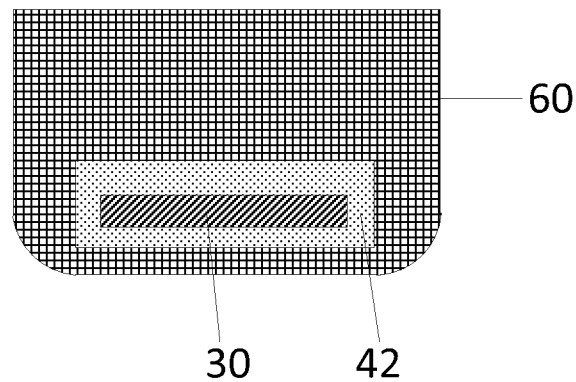
FIG. 3 is a schematic structural top view of a partial film layer of a display device, provided by an embodiment of the present disclosure.

Therefore, in embodiments of the present disclosure, the wave-absorbing material layer 42 is disposed on the side, facing away from the display panel 10, of the support heat dissipation structure 20. As shown in FIG. 3, FIG. 3 is a schematic structural top view of a partial film layer of a display device, and FIG. 3 illustrates a schematic structural top view of the driving chip 30, the wave-absorbing material layer 42, and a sealing glue layer 60 (described later). An orthographic projection of the wave-absorbing material layer 42 on the display panel 10 covers the orthographic projection of the driving chip 30 on the display panel 10, that is, an orthographic projection area of the wave-absorbing material layer 42 is greater than an orthographic projection area of the driving chip 30, so that electromagnetic interference in the driving chip 30 from the circuits in the display panel 10 is effectively prevented.

In some embodiments, since a thickness of the insulating Mylar sheet 43 is generally thin, an overall thickness of the electromagnetic shielding structure will not be increased.

In some embodiments, as shown in FIG. 1, the insulating Mylar sheet 43 is stuck to a side, facing the driving chip IC, of the support heat dissipation structure 20.

Figure 4:
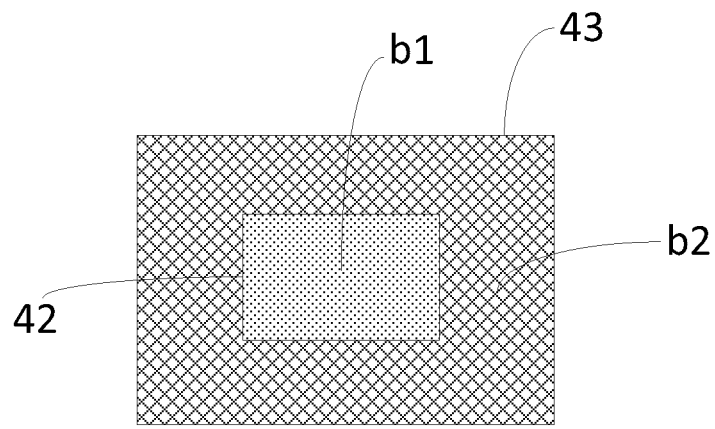
FIG. 4 is a schematic structural top view of a partial film layer of an electromagnetic shielding structure, provided by an embodiment of the present disclosure.

In some embodiments, as shown in FIG. 1 and FIG. 4, FIG. 4 is a schematic structural top view of the wave-absorbing material layer 42 and the insulating Mylar sheet 43 in FIG. 1, the insulating Mylar sheet 43 includes a non-sticking area b1 and a sticking area b2 surrounding the non-sticking area b1, the non-sticking area b1 is in contact with the wave-absorbing material layer 42, and the sticking area b2 is stuck to the support heat dissipation structure 20.

In some embodiments, as shown in FIG. 1, the support heat dissipation structure 20 includes a heat dissipation layer 21 and a support layer 22 disposed in a stack, the heat dissipation layer 21 is close to the display panel 10, and the support layer 22 is far away from the display panel 10; and an orthographic projection of the heat dissipation layer 21 on the display panel covers the display area AA, and an orthographic projection of the support layer 22 on the display panel 10 is within an orthographic projection of the bonding area CC on the display panel 10.

The display device further includes a thin film 50 disposed in contact with the bonding surface 10c of the bonding area CC, the driving chip 30 is fixed on a side, facing away from the display panel 10, of the thin film 50, and an orthographic projection of the driving chip 30 on the display panel 10 and the orthographic projection of the bonding area CC on the display panel 10 do not overlap. That is, the present disclosure adopts a bonding method of COF to bind the driving chip 30 to a side of the bonding surface 10c of the display panel 10.

Since an orthographic projection area of the support layer 22 is smaller than an orthographic projection area of the heat dissipation layer 21, in order not to increase the overall thickness of the display device, the insulating Mylar sheet 43 is stuck to a side, facing the driving chip 30, of the heat dissipation layer 21. In some embodiments, the insulating Mylar sheet 43 is disposed to prevent the metal particles on the surface of the wave-absorbing material layer 42 from falling. Since the insulating Mylar sheet 43 is stuck to the side, facing the driving chip 30, of the heat dissipation layer 21, and the double-sided adhesive tape 41 is disposed on a side, facing away from the insulating Mylar sheet 43, of the wave-absorbing material layer 42, that is, the insulating Mylar sheet 43 wraps the wave-absorbing material layer 42 and the double-sided adhesive tape 41, the wave-absorbing material layer 42 is directly stuck to the side, facing the driving chip 30, of the heat dissipation layer 21.

In some embodiments, a material of the heat dissipation layer 21 is a metal material, the heat dissipation layer 21 may emit heat generated by the display panel 10 to the outside, and the heat dissipation layer 21 may also be configured to conduct static electricity on an organic light emitting display device so as to avoid the impact of static electricity on a display effect. The heat dissipation layer 21 may be a copper foil with good electrical and thermal conductivity. The support layer 22 is configured to prevent the display panel from being physically broken or internal signal lines from being damaged due to a too small bending angle during bending, and can reduce the impact applied to the flexible display panel 10. The support layer 22 may include a polymer, such as polypropylene (PP) or polyethylene (PE), and may also include a material with high elasticity, such as rubber. In embodiments of the present disclosure, the support layer 22 may be formed as foam or gel.

In some embodiments, in order to further avoid the influence of electromagnetic waves generated by the circuits in the display panel on the driving chip, as shown in FIG. 1, the display device further includes: the sealing glue layer 60 disposed on a side, facing away from the display panel 10, of the driving chip 30; and a wave-absorbing material is distributed in the sealing glue layer 60. Therefore, the cooperation of the sealing glue layer 60 and the electromagnetic shielding structure 20 can more effectively block the influence of the electromagnetic waves on the driving chip 30.

Figure 5:
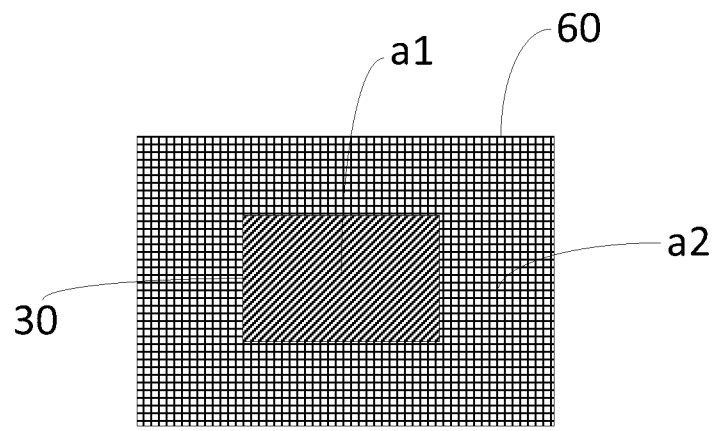
FIG. 5 is a schematic structural top view of a driving chip and a sealing glue layer, provided by an embodiment of the present disclosure.

In some embodiments, as shown in FIG. 1 and FIG. 5, FIG. 5 is a schematic structural top view of the sealing glue layer 60 and the driving chip 30 in FIG. 1, the sealing glue layer 60 has a non-sticking area a1 and a sticking area a2 surrounding the periphery of the non-sticking area a1, the non-sticking area a1 is in contact with the driving chip 30, and the sticking area a2 is stuck to the thin film 50.

In some embodiments, the wave-absorbing material layer generally includes a matrix material and a dielectric wave-absorbing material distributed in the matrix material. In some embodiments, the dielectric wave-absorbing material is generally a wave-absorbing material with a relatively high dielectric constant.

In some embodiments, the matrix material may be an organic adhesive or an inorganic adhesive, and the dielectric wave-absorbing material may include one or a combination of barium titanate, ferrite or soft magnetic metal. Of course, the dielectric wave-absorbing material may also be other possible dielectric wave-absorbing materials.

In some embodiments, in order to achieve the best effect of blocking the electromagnetic waves by the wave-absorbing material layer, in the above display device provided by embodiments of the present disclosure, a thickness of the wave-absorbing material layer may be 0.03 mm to 0.1 mm.

In some embodiments, in order to support and protect the display panel, as shown in FIG. 1, the display device further includes: a first back film 70 disposed on a side, facing the support heat dissipation structure 20, of the non-display surface 10b of the display area AA; and a second back film 80 disposed on a side, facing the support heat dissipation structure 20, of the non-bonding surface 10d of the bonding area CC.

Figure 6:
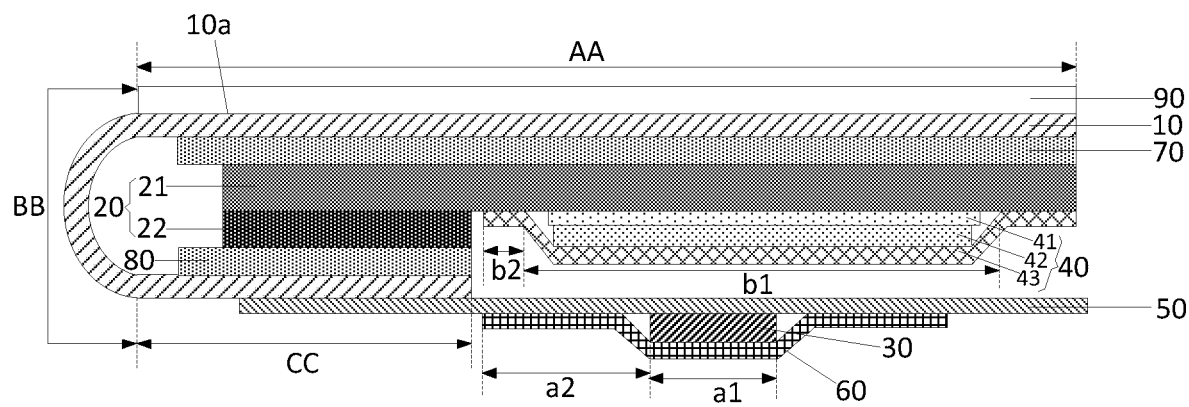
FIG. 6 is a schematic cross-sectional structure diagram of another display device, provided by an embodiment of the present disclosure.

In some embodiments, as shown in FIG. 6, the display device further includes a cover plate 90 that covers the display surface 10a of the display panel 10, and the cover plate 90 is configured to protect components like the display panel 10, and may be, for example, glass or plastic.

Of course, the display device provided by embodiments of the present disclosure may further include other functional film layers well known to those skilled in the art, which will not be described in detail here.

In some embodiments, the display device may be any product or component with a display function, such as a mobile phone, a tablet computer, a television, a displayer, a notebook computer, a digital photo frame and a navigator. Other indispensable components of the display device are understood by those ordinarily skilled in the art, will not be repeated here, and should not be used as a limitation to the present disclosure.

In the above display device provided by embodiments of the present disclosure, the electromagnetic shielding structure is disposed on the side, facing away from the display panel, of the support heat dissipation structure, and the orthographic projection of the electromagnetic shielding structure on the display panel covers the orthographic projection of the driving chip on the display panel, which is equivalent to providing the electromagnetic shielding structure on the side, facing the display panel, of the driving chip, so that the electromagnetic interference in the driving chip from the electromagnetic waves generated by the circuits in the display panel is prevented, thereby improving the performance and working stability of the driving chip.

Although the preferred embodiments of the present disclosure have been described, additional variations and modifications may be made to these embodiments by those skilled in the art once the basic inventive concept is known. Therefore, it is intended that the appended claims be interpreted as including the preferred embodiments and all variations and modifications that fall within the scope of the present disclosure.

It will be apparent to those skilled in the art that various modifications and variations can be made in embodiments of the present disclosure without departing from the spirit or scope of embodiments of the present disclosure. Thus, if these modifications and variations of embodiments of the present disclosure fall within the scope of the claims of the present disclosure and its equivalent technology, the present disclosure is also intended to include these modifications and variations.

What is claimed is:

1. A display device, comprising:
   a display panel, comprising a display area, a bending area and a bonding area, wherein the bending area is arranged between the display area and the bonding area;
   a support heat dissipation structure, disposed on a non-display surface side of the display area;
   a driving chip, fixed to a bonding surface of the bonding area; and
   an electromagnetic shielding structure, fixed on a side, facing away from the display panel, of the support heat dissipation structure;
   wherein the electromagnetic shielding structure comprises:
   a double-sided adhesive tape, fixed on a side, facing away from the display panel, of the support heat dissipation structure;
   a wave-absorbing material layer, disposed on a side, facing away from the display panel, of the double-sided adhesive tape; and
   an insulating biaxially-oriented polyethylene terephthalate (BoPET) sheet, disposed on a side, facing away from the display panel, of the wave-absorbing material layer;
   wherein an orthographic projection of the electromagnetic shielding structure on the display panel covers an orthographic projection of the driving chip on the display panel.

2. The display device according to claim 1, wherein the insulating BoPET sheet is stuck to a side, facing the driving chip, of the support heat dissipation structure.

3. The display device according to claim 2, wherein the insulating BoPET sheet comprises a non-sticking area and a sticking area surrounding the non-sticking area;
   the non-sticking area is in contact with the wave-absorbing material layer; and
   the sticking area is stuck to the support heat dissipation structure.

4. The display device according to claim 1, wherein the wave-absorbing material layer comprises:
   a matrix material; and
   a dielectric wave-absorbing material, distributed in the matrix material.

5. The display device according to claim 4, wherein:
   the matrix material comprises:
   an organic adhesive; or
   an inorganic adhesive;
   and
   the dielectric wave-absorbing material comprises at least one of:
   barium titanate;
   ferrite; or
   soft magnetic metal.

6. The display device according to claim 1, wherein a thickness of the wave-absorbing material layer ranges from 0.03 mm to 0.1 mm.

7. The display device according to claim 1, wherein:
   the support heat dissipation structure comprises a heat dissipation layer and a support layer disposed in a stack, the heat dissipation layer is disposed on the non-display surface side of the display area; the support layer is disposed on a side, facing away from the display surface, of the heat dissipation layer; an orthographic projection of the heat dissipation layer on the display panel covers the display area, and an orthographic projection of the support layer on the display panel is within an orthographic projection of the bonding area on the display panel;
   the display device further comprises a thin film disposed in contact with the bonding surface of the bonding area, the driving chip is fixed on a side, facing away from the display panel, of the thin film, and an orthographic projection of the driving chip on the display panel and the orthographic projection of the bonding area on the display panel do not overlap; and
   the insulating BoPET sheet is stuck to a side, facing the driving chip, of the heat dissipation layer.

8. The display device according to claim 1, further comprising:
   a first back film, disposed on a side, facing the support heat dissipation structure, of the non-display surface of the display area; and
   a second back film, disposed on a side, facing the support heat dissipation structure, of a non-bonding surface of the bonding area.

9. The display device according to claim 1, wherein an orthographic projection of the wave-absorbing material layer on the display panel covers the orthographic projection of the driving chip on the display panel.

10. The display device according to claim 4, wherein a thickness of the wave-absorbing material layer ranges from 0.03 mm to 0.1 mm.

11. The display device according to claim 7, wherein an orthographic projection of the heat dissipation layer on the display panel covers an orthographic projection of the support layer on the display panel.

12. The display device according to claim 7, further comprising:
    a first back film, disposed on a side, facing the support heat dissipation structure, of the non-display surface of the display area; and
    a second back film, disposed on a side, facing the support heat dissipation structure, of a non-bonding surface of the bonding area.

13. The display device according to claim 7, wherein a material of the heat dissipation layer is a metal material.

14. The display device according to claim 7, wherein a material of support layer comprises at least one of: polypropylene, polyethylene or rubber.

15. The display device according to claim 7, further comprising:
   a sealing glue layer, disposed on a side, facing away from the display panel, of the driving chip;
   wherein a wave-absorbing material is distributed in the sealing glue layer.

16. The display device according to claim 15, wherein the sealing glue layer comprises a first non-sticking area and a first sticking area surrounding the first non-sticking area;
   the first non-sticking area is in contact with the driving chip; and
   the first sticking area is stuck to the thin film.

17. The display device according to claim 1, wherein the display panel comprises a flexible base substrate, and
   a material of the flexible base substrate comprises at least one of: polyimide, polyvinyl ether phthalate, polyetherimide or polyethersulfone.

18. The display device according to claim 1, further comprising: a cover plate;
   wherein the cover plate disposed on a display surface side of the display area.

19. A display device, comprising:
   a display panel, comprising a display area, a bending area and a bonding area, wherein the bending area is arranged between the display area and the bonding area;
   a support heat dissipation structure, disposed on a non-display surface side of the display area;
   a driving chip, fixed to a bonding surface of the bonding area; and
   an electromagnetic shielding structure, fixed on a side, facing away from the display panel, of the support heat dissipation structure;
   wherein the support heat dissipation structure comprises a heat dissipation layer and a support layer disposed in a stack, the heat dissipation layer is disposed on the non-display surface side of the display area; the support layer is disposed on a side, facing away from the display surface, of the heat dissipation layer; an orthographic projection of the heat dissipation layer on the display panel covers the display area, and an orthographic projection of the support layer on the display panel is within an orthographic projection of the bonding area on the display panel;
   the display device further comprises a thin film disposed in contact with the bonding surface of the bonding area, the driving chip is fixed on a side, facing away from the display panel, of the thin film, and an orthographic projection of the driving chip on the display panel and the orthographic projection of the bonding area on the display panel do not overlap; and
   an insulating biaxially-oriented polyethylene terephthalate (BoPET) sheet is stuck to a side, facing the driving chip, of the heat dissipation layer.

20. A display device, comprising:
   a display panel, comprising a display area, a bending area and a bonding area, wherein the bending area is arranged between the display area and the bonding area;
   a support heat dissipation structure, disposed on a non-display surface side of the display area;
   a driving chip, fixed to a bonding surface of the bonding area; and
   an electromagnetic shielding structure, fixed on a side, facing away from the display panel, of the support heat dissipation structure;
   wherein the display device further comprises:
   a sealing glue layer, disposed on a side, facing away from the display panel, of the driving chip;
   wherein a wave-absorbing material is distributed in the sealing glue layer.

* * * * *